United States Patent
Mauri et al.

(10) Patent No.: US 11,209,505 B2
(45) Date of Patent: Dec. 28, 2021

(54) LARGE FIELD RANGE TMR SENSOR USING FREE LAYER EXCHANGE PINNING

(71) Applicant: Western Digital Technologies, Inc., San Jose, CA (US)

(72) Inventors: Daniele Mauri, San Jose, CA (US); Yuankai Zheng, Fremont, CA (US); Lei Wang, San Jose, CA (US); Christian Kaiser, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 96 days.

(21) Appl. No.: 16/729,080

(22) Filed: Dec. 27, 2019

(65) Prior Publication Data

US 2021/0063505 A1 Mar. 4, 2021

Related U.S. Application Data

(60) Provisional application No. 62/891,578, filed on Aug. 26, 2019.

(51) Int. Cl.
*G11B 5/39* (2006.01)
*G01R 33/09* (2006.01)
(Continued)

(52) U.S. Cl.
CPC ....... *G01R 33/098* (2013.01); *G01R 33/0052* (2013.01); *G01R 33/093* (2013.01);
(Continued)

(58) Field of Classification Search
None
See application file for complete search history.

(56) References Cited

U.S. PATENT DOCUMENTS 6,282,069 B1 8/2001 Nakazawa et al.
6,930,866 B2 8/2005 Jayasekara
(Continued)

FOREIGN PATENT DOCUMENTS

CN 101788596 A 7/2010
CN 202939205 U 5/2013
KR 10-2011-0068185 A 6/2011

OTHER PUBLICATIONS

International Search Report issued in corresponding International Patent Application No. PCT/US2020/024096, dated Jul. 14, 2020 (12 pages).

(Continued)

*Primary Examiner* — Jefferson A Evans
(74) *Attorney, Agent, or Firm* — Patterson & Sheridan, LLP; Steven H. Versteeg

(57) ABSTRACT

A method of fabricating a TMR based magnetic sensor in a Wheatstone configuration includes conducting a first anneal of a magnetic tunnel junction (MTJ) and conducting a second anneal of the MTJ. The MTJ includes a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second antiferromagnetic pinning layer over the free layer. The first anneal of the MTJ sets the first AFM pinning layer, the pinned layer, the free layer, and the second AFM pinning layer in a first magnetization direction. The second anneal of the MTJ resets the free layer and the second AFM pinning layer in a second magnetization direction. An operating field range of the TMR based magnetic sensor is over ±100 Oe.

20 Claims, 10 Drawing Sheets

(51) Int. Cl.
*G01R 33/00* (2006.01)
*H01L 43/12* (2006.01)
*H01L 43/02* (2006.01)

(52) U.S. Cl.
CPC .......... *G11B 5/3909* (2013.01); *G11B 5/3932* (2013.01); *G11B 5/3945* (2013.01); *H01L 43/02* (2013.01); *H01L 43/12* (2013.01)

(56) References Cited

U.S. PATENT DOCUMENTS

| | | | |
|---|---|---|---|
| 7,027,273 | B2 | 4/2006 | Yoshikawa et al. |
| 7,598,579 | B2 | 10/2009 | Horng et al. |
| 9,021,685 | B2 | 5/2015 | Zhao et al. |
| 9,591,221 | B2 | 3/2017 | Miller et al. |
| 9,684,184 | B2 | 6/2017 | Miller et al. |
| 9,741,372 | B1* | 8/2017 | Campiglio ............... H01L 43/12 |
| 2007/0063690 | A1* | 3/2007 | De Wilde ............... G11C 11/16 324/117 R |
| 2008/0271818 | A1 | 11/2008 | Paul et al. |
| 2011/0141803 | A1 | 6/2011 | Kim et al. |
| 2011/0227569 | A1* | 9/2011 | Cai ...................... G01R 33/093 324/252 |
| 2012/0326713 | A1* | 12/2012 | Zimmer ................. G01R 33/09 324/252 |
| 2013/0099780 | A1 | 4/2013 | Ma et al. |
| 2014/0054733 | A1* | 2/2014 | Deak ....................... H01L 43/02 257/427 |
| 2015/0091560 | A1* | 4/2015 | Deak .................... G01R 33/093 324/252 |
| 2015/0192648 | A1* | 7/2015 | Campiglio ............... G11B 5/39 324/252 |
| 2019/0020822 | A1 | 1/2019 | Sharma et al. |
| 2019/0339341 | A1* | 11/2019 | Lim ..................... G01R 33/093 |
| 2020/0096195 | A1* | 3/2020 | Babington .............. F23N 1/005 |
| 2020/0321159 | A1* | 10/2020 | Han ...................... H01F 41/304 |
| 2020/0348374 | A1* | 11/2020 | Saito .................... G01R 33/093 |

OTHER PUBLICATIONS

R. Ferreira et al.; "Large Area and Low Aspect Ratio Linear Magnetic Tunnel Junctions with a Soft-Pinned Sensing Layer" IEEE Transactions on Magnetics, vol. 48, No. 11, pp. 3719-3722; Nov. 2012.

Emilse Martinez Paz et al.; "Linearization of Magnetic Sensors with a Weakly Pinned Free-Layer MTJ Stack Using a Three-Step Annealing Process" IEEE Transactions on Magnetics, vol. 52, No. 7, Jul. 2016 (4 pages).

Herbert Weitensfelder et al.; "Comparison of Sensitivity and Low Frequency Noise Contributions in GMR and TMR Spin Valve Sensors with a Vortex State Free Layer" https://arxiv.org/pdf/1804.06940.pdf; Apr. 18, 2018 (6 pages).

Zhengqi Lu et. al.; "Doubly Exchange-Biased FeMn/NiFe/Cu/NiFe/CrMnPt Spin Valves" IEEE Transactions on Magnetics, vol. 36, No. 5, pp. 2899-2901; Sep. 2000.

Paulo P. Freitas et al.; "Spintronic Sensors" Proceedings of the IEEE; vol. 104, No. 10, pp. 1984-1918; Oct. 2016.

* cited by examiner

LARGE FIELD RANGE TMR SENSOR USING FREE LAYER EXCHANGE PINNING

CROSS-REFERENCE TO RELATED APPLICATIONS

This application claims benefit of U.S. provisional patent application Ser. No. 62/891,578, filed Aug. 26, 2019, which is hereby incorporated by reference.

BACKGROUND OF THE DISCLOSURE

Field of the Disclosure

Embodiments of the present disclosure generally relate to a large field range TMR sensor of magnetic tunnel junctions (MTJs) with a partially pinned free layer.

Description of the Related Art

Hall effect magnetic sensors are inexpensive, have large operating field range, have good linearity, but have low sensitivity. Magnetoresistive (MR) sensors, on the other hand, have much larger sensitivity (>100×) but are typically designed for low field applications less than 80 Oe. For some applications, there is a need for high sensitivity sensors with a working range above 80 Oe. For instance, the application may be suited for detection of fields in the plane of the sensor (as is the case for MR sensors) rather than fields perpendicular to the sensor plane (as is typical for Hall sensors).

Zhengqi Lu et al., "Doubly exchange-biased FeMn/NiFe/Cu/NiFe/CrMnPt spin valves" Doubly exchange-biased FeMn/NiFe/Cu/NiFe/CrMnPt spin valves, vol. 36, issue 5 (September 2000) discloses a spin valve without a barrier layer in which two ferromagnetic layers are exchange biased in opposite directions by to different antiferromagnetic layers. The doubly exchanged-biased spin valves are for high sensitivity for low field strength for reading high recording density of over 10 Gbit/int. However, there is a need for a sensor for use in large field range including high field strengths.

SUMMARY OF THE DISCLOSURE

Embodiments of the present disclosure generally relate to a large field range TMR sensor of MTJs with a partially pinned free layer and method of fabricating the TMR sensor.

In one embodiment, a method of fabricating a TMR based magnetic sensor in a Wheatstone configuration includes conducting a first anneal of a magnetic tunnel junction (MTJ) and conducting a second anneal of the MTJ. The MTJ includes a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second antiferromagnetic pinning layer over the free layer. The first anneal of the MTJ sets the first AFM pinning layer, the pinned layer, the free layer, and the second AFM pinning layer in a first magnetization direction. The second anneal of the MTJ resets the free layer and the second AFM pinning layer in a second magnetization direction. An operating field range of the TMR based magnetic sensor is over ±100 Oe.

In another embodiment, a method of fabricating a TMR based magnetic sensor in a Wheatstone configuration includes conducting a first anneal of a magnetic tunnel junction (MTJ) at a first external magnetic field strength, at a first external magnetic direction, and at a first temperature and conducting a second anneal of the MTJ at a second external magnetic field strength, at a second external magnetic direction, and at a second temperature. The first external magnetic field strength of the first anneal is greater than the second external magnetic field strength of the second anneal. The first external magnetic direction of the first anneal is different than the second external magnetic direction of the second anneal. The first temperature of the first anneal is greater than the second temperature of the second anneal. The MTJ includes a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second antiferromagnetic pinning layer over the free layer.

In one embodiment, a TMR based magnetic sensor in a Wheatstone configuration includes a plurality of MTJs. Each of the plurality of MTJs includes a reference layer in a first magnetization direction, a free layer, and an antiferromagnetic (AFM) pinning layer. The AFM pinning layer partially pins the free layer in a second magnetization direction orthogonal, at an acute angle, or at an obtuse angle to the first magnetization direction of the reference layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Certain embodiments are directed to a magnetoresistive element, such as a magnetic tunnel junction (MTJ), comprising a partially pinned free layer. Such MTJs can be coupled together to form a tunnel magnetoresistive (TMR) based magnetic sensor in a Wheatstone configuration. The TMR based magnetic sensor can detect a large operating field range, such as operating fields in the hundreds Oe range to a few thousands Oe range. The MTJs can have a low hysteretic response. The TMR based magnetic sensor can have a low hysteretic response and a high linear response (i.e., low linearity ratio) to a desired range of sensed magnetic fields.

Figure 1:
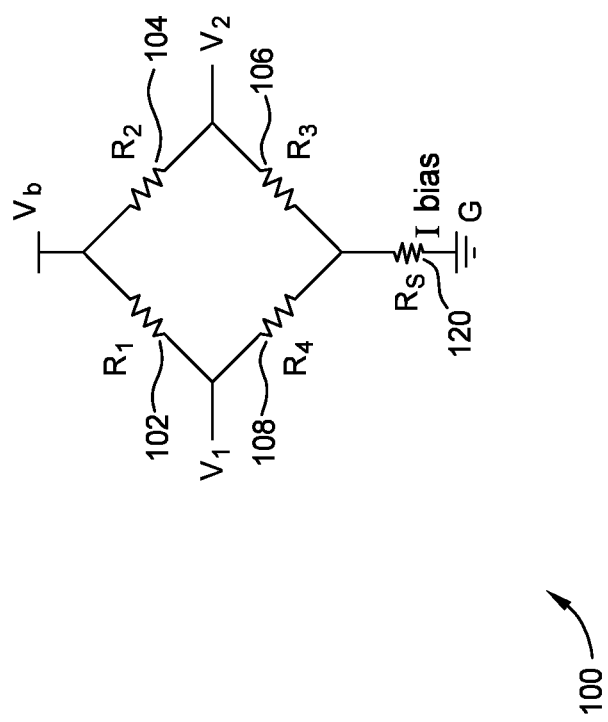
FIG. 1 is a circuit diagram illustrating certain embodiments of a tunnel magnetoresistive based magnetic sensor in a Wheatstone configuration.

FIG. 1 is a circuit diagram illustrating certain embodiments of a TMR based magnetic sensor 100 in a Wheatstone configuration. The TMR based magnetic sensor 100 can include four variable resistor legs of a first magnetoresistance leg 102, a second magnetoresistance leg 104, a third magnetoresistance leg 106, and a fourth magnetoresistance leg 108 arranged in a Wheatstone configuration. Terminal Vb and terminal G are used to provide a bias voltage/current from Vb to G. Terminals V1 and V2 are used to measure signals of the voltage difference between V1 and V2 representing a sensed magnetic field. Terminals V1 and V2 may be coupled to an optional amplifier to amplify the signal. The TMR based magnetic sensor 100 may optionally include a series resistor 120 which can be used to adjust the DC level of V1 and V2.

Neighboring magnetoresistance legs are formed to opposite polarity. For example, the first magnetoresistance leg 102 and the third magnetoresistance leg 106 can have a positive response to a sensed magnetic field and the second magnetoresistance leg 104 and the fourth magnetoresistance leg 108 can have a negative response to the sensed magnetic field. In another example, the first magnetoresistance leg 102 and the third magnetoresistance leg 106 can have a negative response to a sensed magnetic field and the second magnetoresistance leg 104 and the fourth magnetoresistance leg 108 can have a positive response to the sensed magnetic field.

The TMR based magnetic sensor 100 in a Wheatstone configuration provides double the signal based upon the same sensing bias current in comparison to a sensor with a single magnetoresistance leg. The TMR based magnetic sensor 100 in a Wheatstone configuration has reduced impact to thermal drifts in comparison to a sensor with a single magnetoresistance leg. Although the TMR based magnetic sensor 100 of FIG. 1 is shown in a full Wheatstone configuration with four variable resistor legs, in other embodiments the TMR based magnetic sensor can comprise a quarter Wheatstone bridge configuration with one variable resistor leg and three fixed resistor legs or a half Wheatstone bridge configuration with two variable resistor legs and two fixed resistor legs.

Figure 2:
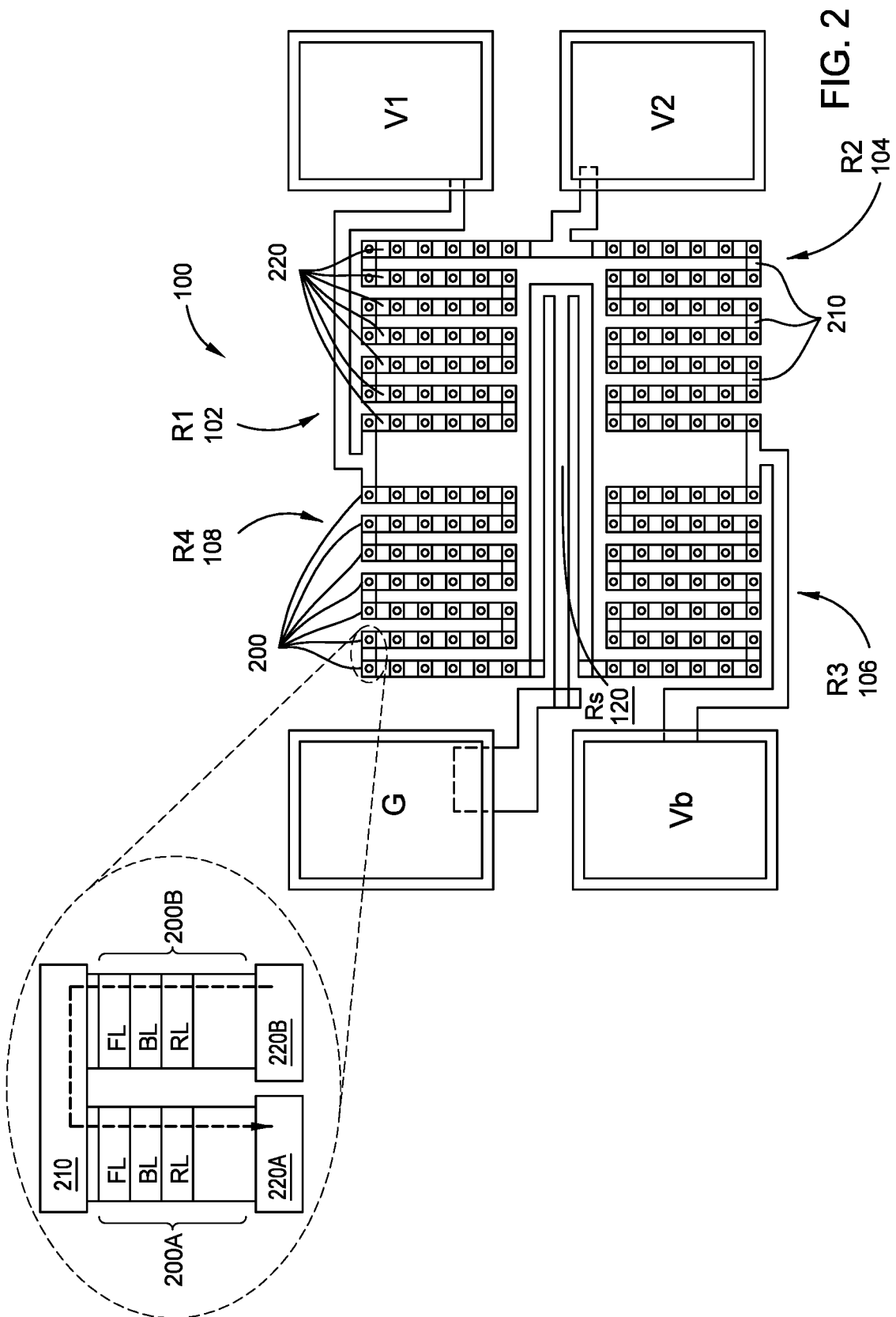
FIG. 2 is a schematic plan view of a layout illustrating certain embodiments of a TMR based magnetic sensor in a Wheatstone configuration of FIG. 1.

FIG. 2 is a schematic plan view of a layout illustrating certain embodiments of the TMR based magnetic sensor 100 in a Wheatstone configuration of FIG. 1. For ease of description, FIG. 2 includes like numerals as used in FIG. 1. As shown in FIG. 2, each of the four magnetoresistance legs 102, 104, 106, 108 comprises a string of MTJs 200 coupled in series. The MTJs 200 in a magnetoresistance leg are coupled together by a plurality of top electrodes 210 and a plurality of bottom electrodes 220. In certain embodiments, each magnetoresistance leg 102, 104, 106, 108 individually comprises from 10 to 100 MTJs, such as from 20 to 50 MTJs. In certain embodiments, the TMR based sensor 100 can be made to occupy a surface area from about 0.1 mm$^2$ to about 50 mm$^2$.

In one aspect, MTJs 200 connected in series reduce the overall noise of the sensed magnetic field for the same signal level in comparison to a leg composed of a single MTJ. For example, the insert shows an enlarged cross-sectional view of certain embodiments of two MTJs 200A, 200B formed after patterning. The two MTJs 200A, 200B are coupled in series sharing the same top electrode 210 with different bottom electrodes 220A, 220B with an electron current flow as shown in the dotted lined.

Noise in the MTJ may arise from electrical sources, like charge trapping in the MTJ barrier, or magnetic sources such as thermally activated local magnetization angle changes. Since the noise in each MTJ is essentially uncorrelated, the series connection of MTJs 200 reduces the overall noise. In another aspect, MTJs 200 connected in series reduce the voltage drop across each individual MTJ 200 improving reliability of the TMR based magnetic sensor in comparison to a leg composed of a single MTJ. For example, a barrier layer of a MTJ has a certain lifetime based upon the total voltage across the MTJ. By spreading the voltage drop across a plurality of MTJs 200, the voltage drop across a single MTJ from the plurality of MTJs 200 is reduced. The reduced voltage drop across each MTJ increases the lifetime and reliability of each MTJ 200 and thus increases the lifetime and reliability of the sensor 100 as well.

Other layouts of a TMR based sensor are possible, such as other layouts of MTJs in series and/or in parallel, other layouts of the electrodes, and other layouts of the terminals.

Figure 3:
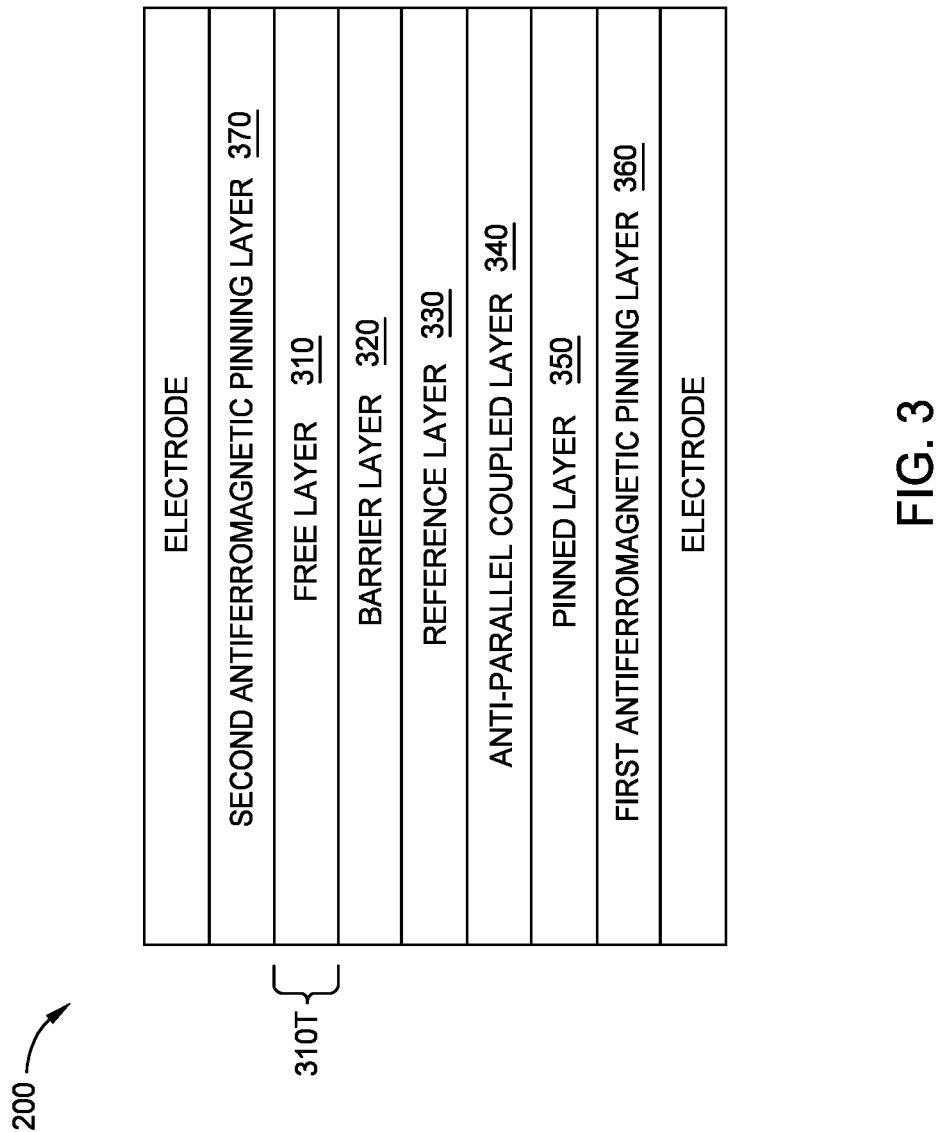
FIG. 3 is a schematic side view illustrating certain embodiments of a single MTJ.

FIG. 3 is a schematic side view illustrating certain embodiments of a single MTJ 200, such as one of the MTJs 200 of FIG. 2. The single MTJs 200 can be used in the plurality of MTJs connected in series forming the magnetoresistance legs of TMR based magnetic sensor 100 of FIG. 2 or other suitable TMR based magnetic sensors. For ease of description, FIG. 3 includes like numerals as used in FIG. 2. The MTJ 200 comprises a free layer (FL) 310, a barrier layer 320, a reference layer (RL) 330, an antiparallel (AP) coupled layer 340, a pinned layer (PL) 350, and a first antiferromagnetic (AFM1) pinning layer 360. The MTJ 200 further comprises a second AFM pinning layer (AFM2) 370 to partially pin the FL 310.

As shown in FIG. 3, the PL 350, the AP coupling layer 340, and the RL 330 form a synthetic antiferromagnetic (SAF) pinned structure. In other embodiments, the MTJ 200 may comprise a simple pinned structure or may comprise two or more SAF pinned structures. The MTJ 200 may include other layers, such as seed layer(s) (not shown), capping layer(s) (not shown), contact layers, and other pinning structures.

The FL 310 can comprise single or multiple layers of CoFe, NiFe, other ferromagnetic materials, and combinations thereof. The barrier layer 320 can comprise single or multiple layers of magnesium oxide, aluminum oxide, other dielectric materials, and combinations thereof. The RL 330 can comprise single or multiple layers of CoFe, other ferromagnetic materials, and combinations thereof. The antiparallel (AP) coupled layer 340 can comprise single or multiple layers of Ru, Ru alloys other non-magnetic materials, and combinations thereof. The PL 350 can comprise single or multiple layers of CoFe, CoB, CoFeB, other ferromagnetic materials, and combinations thereof. The AFM1 pinning layer 360 and AFM2 pinning layer 370 can each independently comprise single or multiple layers of PtMn, NiMn, IrMn, IrMnCr, CrMnPt, FeMn, other antiferromagnetic materials, and combinations thereof.

The AFM1 pinning layer 360 has a fixed magnetization that in turn substantially fixes the magnetic moment of the PL 350. The RL 330 is antiparallel coupled with the PL 350 across the antiparallel coupling layer 340. Accordingly, the magnetization of the RL 330 is set in a second direction that is antiparallel to the direction of the magnetization of the PL 350. The AFM2 pinning layer 370 has a fixed magnetization that in turn partially pins the FL 310.

The FL 310 of the MTJ 200 rotates in the presence of a sensed magnetic field relatively to the RL 330. The rotation of the FL 310 relatively to the RL 330 changes the resistance of the MTJ 200. For example, the resistance of the MTJ 200 with the FL 310 and the RL 330 in an anti-parallel state can be three times higher than the FL 310 and the RL 330 in a parallel state. In certain operating magnetic field ranges, magnetization of the FL 310 can rotate while the magnetization directions of the RL 330 and the PL 350 are substantially unrotated by external magnetic fields.

The AFM2 pinning layer 370 partially pins the FL 310 to adjust the permeability or rate of magnetization rotation of the FL 310 in an external field. One parameter controlling the external field operational range of the MTJ and associated TMR sensor is controlled by the amount of pinning of the FL 310 from the AFM2 pinning layer 370.

FIGS. 4A-4B are schematic top views of a MTJ 200 of FIG. 3 illustrating certain embodiments of a process of setting magnetization directions of the AFM1 pinning layer 360 and the AFM2 pinning layer 370. The anti-parallel coupled layer 340 and the barrier layer 320 have been omitted in FIGS. 4A-4B for ease of description. FIGS. 4A-4B show MTJs 200 formed as squares with non-shape anisotropy. In other embodiments, the MTJ 200 can be formed as circles, ovals, or other shapes with non-shape anisotropy.

FIG. 4A shows a MTJ 200 after performing a first anneal. The first anneal of the MTJ 200 is performed at a large applied magnetic field of about 3.5 T or above at a high temperature of about 250° C. or above for a time period of about 1 hr to about 10 hrs in a magnetic annealing oven. One example of a magnetic annealing oven is a MRT system from Tokyo Electron Ltd. located in Tokyo, Japan. The first direction 400 of the applied magnetic field sets the magnetization direction of the AFM1 pinning layer 360 and the AFM2 pinning layer 360. The magnetization of direction of the AFM1 pinning layer 360 and the AFM2 pinning layer 370 is first set during the first anneal in a desired direction of the PL 350. The desired PL direction is parallel to the final field sensing axis of the MTJ 200. The applied magnetic field is of sufficient strength to reset the SAF coupling and to saturate the PL 350/AP coupled layer 340/RL 330 structure. The temperature of the first anneal is of sufficient temperature to recrystallize the barrier layer 320 to achieve a high TMR ratio. The response of the FL 310 after the first anneal is hysteretic and nonlinear.

FIG. 4B shows the MTJ 200 of FIG. 4A after performing a second anneal. A second anneal is performed to achieve a lower hysteretic response and a more linear response. The second anneal with an applied magnetic field in a second direction 402 rotates the pinning axis of the FL 310 by rotating the magnetization direction of the AFM2 pinning layer 370. The pinning axis of the FL 310 can be rotated substantially orthogonal to the magnetization direction of the reference layer 330 (as shown in FIG. 4B) or can be rotated at an angle to the reference layer 330.

The second anneal is performed at a lower applied magnetic field and a lower anneal temperature than the first anneal to avoid or reduce any change to the magnetization direction of the PL 350 from the first anneal. The second anneal is performed at a temperature larger than the blocking temperature of the AFM2 pinning layer 370. The second anneal is performed at a field strength sufficient to saturate the FL 310 to its edges or in the presence of a topological roughness of the FL. In certain embodiments, the second anneal is performed at a low applied magnetic field of from about 400 Oe to about 2,500 Oe at a temperature from about 130° C. to about 230° C. for a time period of about 0.5 hrs to about 5 hrs in a magnetic annealing oven. In certain embodiments, the MTJ 200 comprises an AFM1 pinning layer 360 of a different material composition than the AFM2 pinning layer in which the blocking temperatures of the AFM1 pinning layer are higher than the blocking temperatures of the AFM2 pinning layer. For example, antiferromagnetic material CrMnPt has a blocking temperature of about 320° C.; antiferromagnetic material IrMn has a blocking temperature of about 200° C.; and antiferromagnetic material FeMn has a blocking temperature of about 140° C. The blocking temperature can vary dependent on the thickness of the AFM pinning layer.

The second anneal does not negatively impact the TMR ratio of the MTJ 200. The second anneal can be performed before or after patterning of the TMR stack to define the individual MTJs 200. In certain embodiments, the second anneal is performed to the full film TMR stack prior to patterning for easier control of good magnetic alignment without edges by using a lower applied field which minimizes any stress on AFM1 360 in comparison to a second anneal performed after patterning.

In one aspect, partially pinning the FL 310 by the AFM2 pinning layer 370 controls magnetic domain formations of the FL 310 and controls the response of TMR based magnetic sensor 100 comprising the MTJs 200. A larger FL pinning by the AFM2 pinning layer impacts the magnetic field operating range and linearity of the response of the TMR based magnetic sensor 100. The pinning field strength acting on the FL 310 and thus the saturation field of the FL 310 scales inversely to the thickness of the FL 310 (i.e., 1/tFL). The thinner the FL 310 corresponds to a larger saturation field, and the lower the force required by the AMF2 pinning layer to prevent or reduce edge domain formation.

With partially pinning of the FL 310 by the by the AFM2 pinning layer, external hard bias stabilization can be omitted. External hard bias (HB) stabilization increases the material cost and fabrication time of a sensor. Hard magnetic materials forming HB stabilization are relatively expensive in cost. Another drawback of using HB stabilization is that the sensor will degrade when exposed to a field approaching the HB coercivity. For example, a field of about 3,000 Oe can degrade or reset the direction of the HB stabilization comprising CoPt. A MTJ 200 with a FL 310 partially pinned by an AFM2 pinning layer 370 can tolerate large disturb field with low degradation of the TMR based magnetic sensor 100.

The free layer 310 has a thickness chosen to optimize the TMR coefficient and the anisotropy. The MTJ 200 and thus a TMR based magnetic sensor comprising a plurality of the MTJs 200 can operate over large field ranges, such as in the hundreds Oe range to a few thousands Oe range. Prior art MTJs typically operate over small field ranges, such as ±80 Oe. In certain embodiments, a TMR based magnetic sensor comprising a plurality of the MTJs 200 in a Wheatstone configuration can operate over large external magnetic field ranges, such over a magnetic field range of ±100 Oe, such over a magnetic field range of ±150 Oe, such as ±600 Oe, such as ±1,000 Oe, or such as ±3,000 Oe. In certain embodiments, a TMR based magnetic sensor comprising a plurality of the MTJs 200 in a Wheatstone configuration can operate over large external magnetic field ranges added to a constant DC field, such over a magnetic field range of ±100 Oe superimposed over a constant DC field, such over a magnetic field range of ±150 Oe superimposed over a constant DC field, such as ±600 Oe superimposed over a constant DC field, such as ±1,000 Oe superimposed over a constant DC field, or such as ±3,000 Oe superimposed over a constant DC field.

A relatively thick free layer may undesirably form multiple magnetic domains which would undesirably provide a hysteretic response for the MTJ. Partially pinning the FL 310 by the AFM2 pinning layer 370 controls magnetic domain formation and provides a lower hysteretic response. In certain embodiments, the MTJ 200 with partially pinning of the FL 310 further comprises shape anisotropy to enhance the saturation field, to control magnetic domain formation, and/or to provide a lower hysteretic response.

Figure 4:
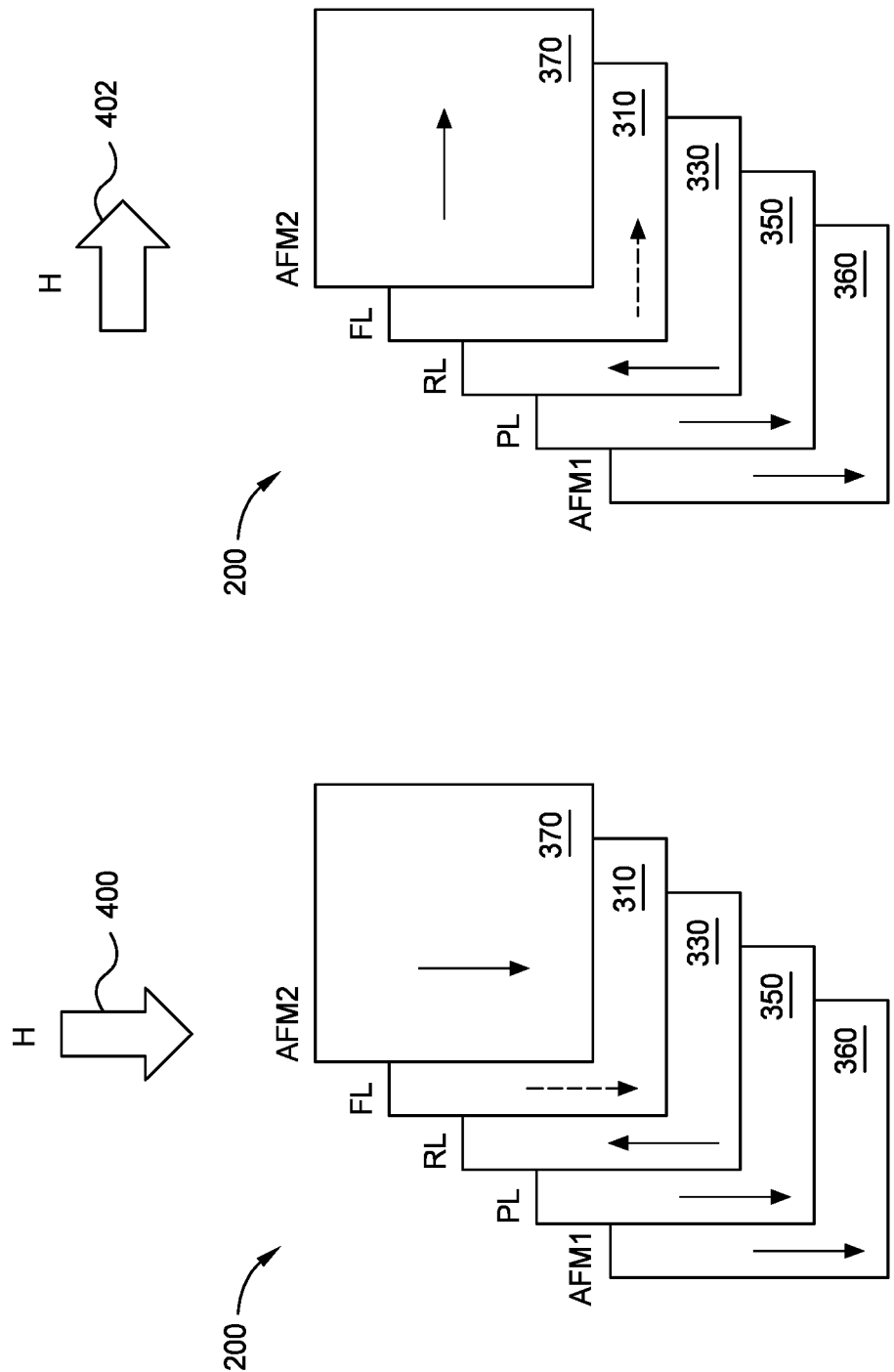
FIGS. 4A-4B are schematic top views of a MTJ of FIG. 3 illustrating certain embodiments of a process of setting magnetization directions of a second antiferromagnetic pinning layer and a second antiferromagnetic pinning layer.
Figure 5:
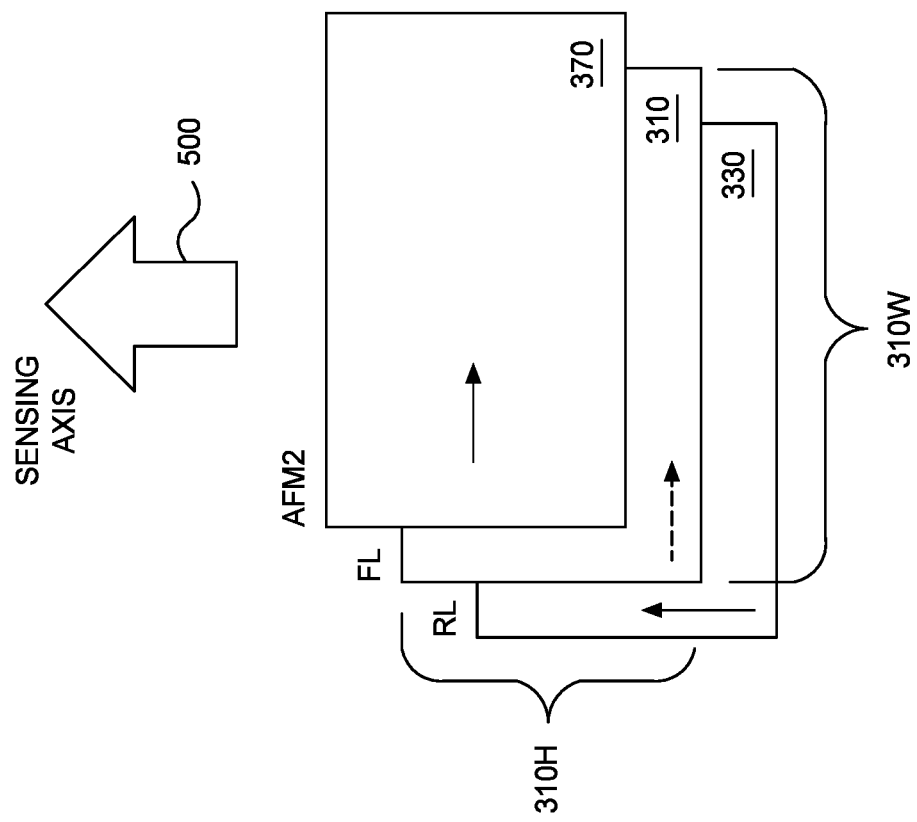
FIG. 5 is a schematic top view illustrating certain embodiments of a single MTJ of FIG. 4B after a first anneal and after a second anneal.

FIG. 5 is a schematic top view illustrating certain embodiments of a single MTJ 200 of FIG. 4B after a first anneal and after a second anneal in which the FL 310 is partially pinned by the AFM2 pinning layer 370 orthogonal or at an angle to the RL 330. For ease of description, FIG. 5 includes like numerals as used in FIG. 4B. The AFM1 pinning layer 360, the PL 350, the anti-parallel coupled layer 340, and the barrier layer 320 have been omitted in FIG. 5. for ease of description. The MTJ 200 comprises a partially pinned FL 310 with shape anisotropy.

Shape anisotropy is provided by an aspect ratio (width-to-height) of the free layer 310 with a narrow height (310H) in the direction 500 of the magnetic field to be sensed (i.e., the short axis of the MTJ 200 is aligned with the sensing field) and with a large width (310W) in a orthogonal direction to the sensing direction. For example, a free layer 310 formed as a rectangular strip, as shown in FIG. 5, provides shape anisotropy. The free layer 310 with shape anisotropy can be other elongated polygons, such as other elongated trapezoid, other elongated quadrilaterals, elongated ovals, other elongated regular shapes, and other elongated irregular shapes. For an elongated trapezoid, the high width-to-height ratio is calculated by the average of the two widths of the elongated trapezoid with two different widths or calculated by the average of the two heights of the elongated trapezoid with two different heights.

In certain embodiments, the free layer 310 is formed to a width 310W and to a height 310H in a width-to-height ratio of about 4:1 or more, such as from about 7:1 to about 25:1. In certain embodiments, the width 310W of the free layer 310 can be formed from about 1 µm to about 10 µm and the height 310H of the free layer can be formed from about 0.2 µm to about 2 µm. The free layer 310 with a width-to-height ratio of about 4:1 or more has a substantially single magnetic domain initially aligned in a general direction along the width 310W of the free layer 310 of the MTJ 200. The large width 310W helps to control magnetic domain formation to be along the length of the width.

For a free layer 310 with a high aspect ratio, the magnetization of the free layer will respond to or rotate to an external magnetic field up to a saturation field given by following approximation (1):

$$H\text{sat}=j\text{ pin}/tFL+4\pi M_{FL}*tFL/H \quad (1)$$

in which H is the height of the free layer, tFL is thickness of the free layer, $M_{FL}$ is the saturation magnetization of the free layer material (for permalloy $M_{FL}$ is around 780 emu/cm$^3$), the pinning field strength (Hpin)=jpin/tFL. The pinning field Hpin is typically larger for thinner FL while the shape anisotropy field in the second term is larger for thicker FL. The dynamic range of the MTJ, and thus the sensor depends on the interplay of the competing terms of the pinning field strength and shape anisotropy field and can be adjusted by the thickness of the FL. The magnetic saturation field ($H_k$ eff) can by determined by plotting the resistance response of the MTJ from a near zero sensed magnetic field to a maximum resistance response.

In certain aspects, shape anisotropy of the free layer 310 can improve linearity. In certain aspects, shape anisotropy of the free layer 310 can adjust the operating field range of the TMR based magnetic sensor 100.

Figure 6:
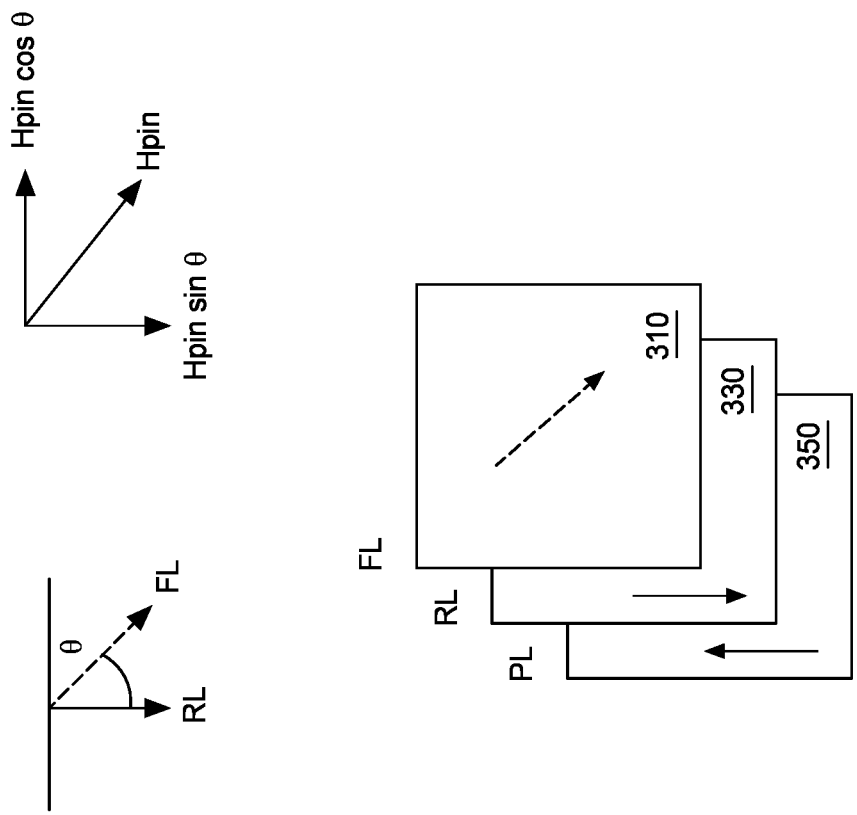
FIG. 6 is a schematic top view illustrating embodiments of a single MTJ of FIG. 4B after a first anneal and after a second anneal in which a free layer is partially pinned at an angle to a reference layer.

FIG. 6 is a schematic top view illustrating embodiments of a single MTJ 200 of FIG. 4B after a first anneal and after a second anneal in which the FL 310 is partially pinned by the AFM2 pinning layer 370 at an angle to the RL 330. For ease of description, FIG. 6 includes like numerals as used in FIG. 4B. The AFM1 pinning layer 360, the anti-parallel coupled layer 340, the barrier layer 320, and the AFM2 pinning layer 370 have been omitted in FIG. 6 for ease of description. FIG. 6 shows a MTJ 200 formed as a square with non-shape anisotropy. In other embodiments, the MTJ

200 can be formed as a circle, an oval, another shape with non-shape anisotropy, a rectangle, an elongated rectangle, an elongated oval, or another elongated shape.

The FL 310 is partially pinned at an acute angle to the RL 330. A FL 310 partially pinned at an acute angle to the RL 330 produces two effects which change the field center and the dynamic range of the sensor.

1) The pinning field Hpin has a component $Hpin*\sin(\ominus)$ in the negative direction along the sensing axis. The $Hpin*\sin(\ominus)$ component offsets the operating range of sensor in the positive direction because an external field $Hext=Hpin*\sin(\ominus)$ brings the FL magnetization orthogonal to the reference layer 330. In other words, the midpoint of the sensing range shift by $+Hpin*\sin(\ominus)$.

2) The longitudinal component of Hpin is reduced to $Hpin*\cos(\ominus)$ lowering the saturation field.

The MTJs 200 of FIGS. 3-5 can be fabricated in an array to form the magnetoresistance legs 102, 104, 106, 108 of FIGS. 1-2. One example of fabricating magnetoresistance legs of opposite polarities is to form a positive polarity leg with a plurality of first MTJs and to form a negative polarity leg with a plurality of second MTJs in which the first MTJs and the second MTJs comprise two different film stacks having different resistance area products. Another example of fabricating magnetoresistance legs of opposite polarities is to form a positive polarity leg and a negative polarity leg with the MTJs of a single film stack with signal polarity controlled by thermal reset. In either method, the magnetoresistance legs of opposite polarities can be fabricated on the same wafer substrate. In other words, four magnetoresistance legs 102, 104, 106, 108 can be fabricated on the same wafer substrate by depositing the same film stack or by depositing different films stacks making up each MTJ.

Figure 10B:
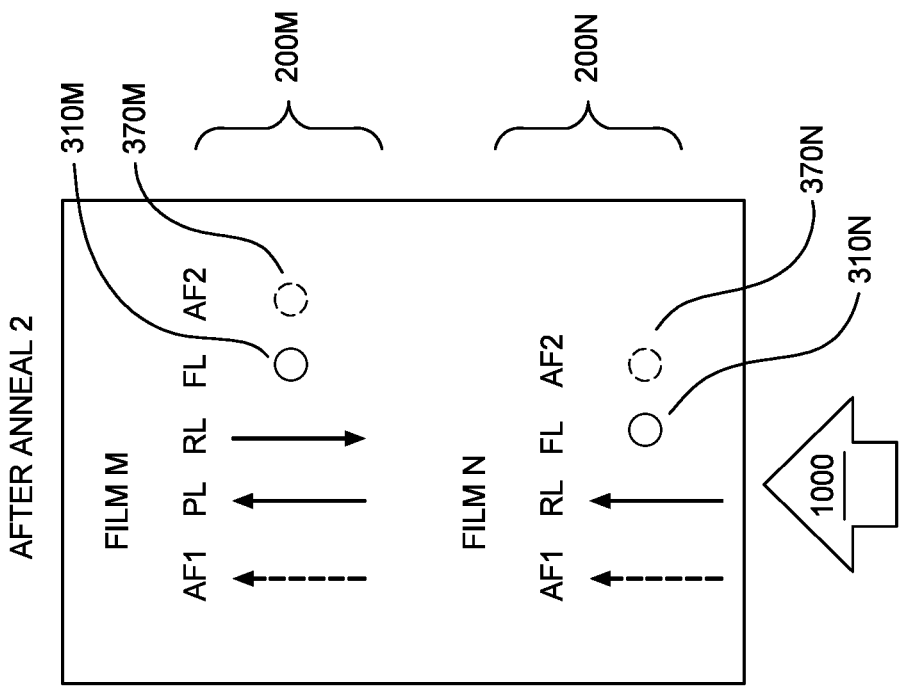
FIGS. 10A-10B are schematic illustrations of forming two different MTJs with different polarities on the same die by having different pinned structures.
Figure 10A:
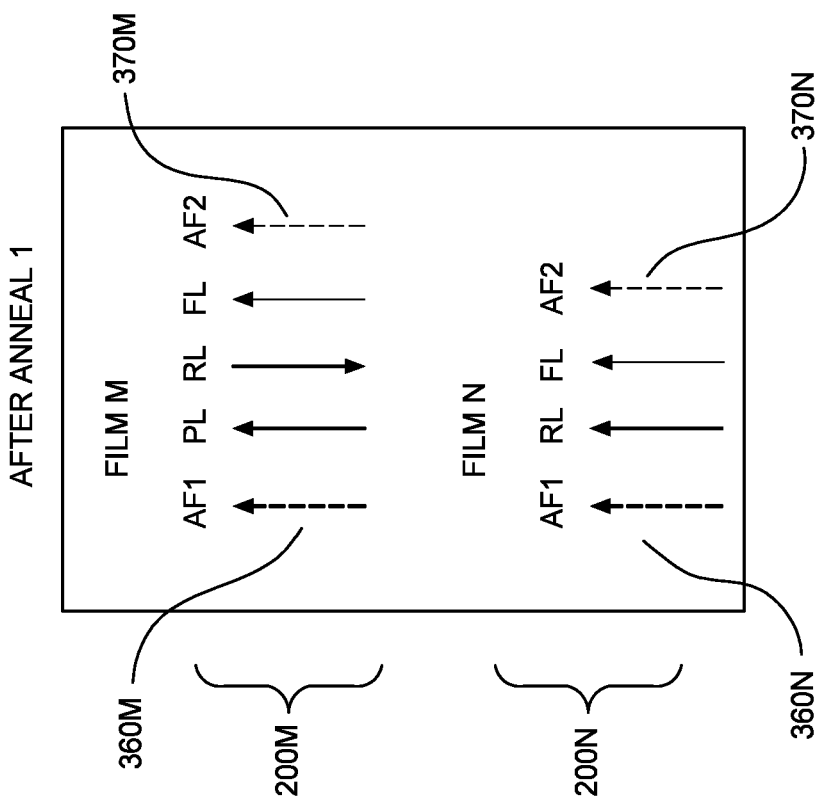

FIGS. 10A-10B are schematic illustrations of forming two different MTJs with different polarities on the same die by having any suitable different pinned structures (simple pinned, single synthetic antiferromagnetic (SAF) pinned structure, double SAF structure, etc.). For example, in FIG. 10A, a first MTJ 200M comprising a film stack M utilizing a synthetic antiferromagnetic (SAF) pinned structure and a second MTJ 200N comprising a film stack N utilizing a non-SAF pinned structure. FIG. 10A shows the MTJs 200M, 200N after performing a first anneal, such as a first anneal as described in reference to FIG. 4A, to set the magnetization directions of the AFM1 pinning layer 360M and AFM2 pinning layer 370M of the first MTJ 200M and of the AFM1 pinning layer 360N and AFM2 pinning layer 370N of the second MTJ 200N in the same direction.

FIG. 10B shows the first MTJ 200M and the second MTJ 200N of FIG. 10A after performing a second anneal, such as a second anneal as described in reference to FIG. 4AB. The second anneal with an applied magnetic field in a second direction orthogonal to or angled to the direction of the first anneal rotates the pinning axis of the FLs 310M, 310N by rotating the magnetization directions of the AFM2 pinning layers 370M, 370N. The magnetization directions of the AFM2 pinning layers 370M, 370N of the first MTJ 200M and the second MTJ 200N are set in the same direction. The first MTJ 200M and the second MTJ 200N have opposite polarities. For example, the first MTJ 200M and the second MTJ 200N sense an external magnetic field 1000, the resistance of the first MTJ 200M increases because the RL-FL angle is getting larger while the resistance of the second MTJ 200N decreases because the RL-FL angle is getter smaller.

A TMR based magnetic sensor 100 in a Wheatstone configuration of FIGS. 1-2 comprising the MTJs 200 of FIGS. 3-5 and 10 can have a signal/voltage output of the bridge to be zero at a desired sensed magnetic field. For example, a TMR based magnetic sensor 100 can have a signal/voltage output of the bridge to be zero at a zero sensed magnet field. In another example, a TMR based magnetic sensor 100 can have a signal/voltage output of the bridge to be zero at a desired non-zero sensed magnet field (such as at a sensed magnetic field of from about 300 Oe to about 500 Oe). A TMR based magnetic sensor 100 having a signal/voltage output of the bridge at zero at a desired non-zero sensed magnet field can be fabricated by adding magnetically insensitive resistors in selected legs of the bridge. For example, for a TMR based magnetic sensor 100 having a signal/voltage output of the bridge at zero at a zero sensed magnet field, the working range of the sensor in certain embodiments is from about −600 Oe to about +600 Oe. In another example, for a TMR based magnetic sensor 100 having a signal/voltage output of the bridge at zero at about −450 Oe sensed magnet field of a constant DC field, the working range of the sensor in certain embodiments is ±600 Oe superimposed over the constant DC field, in other words from about −1050 Oe to about +150 Oe.

In certain embodiments, a TMR based magnetic sensor 100 in a Wheatstone configuration of FIGS. 1-2 comprised of the MTJs 200 of FIGS. 3-5 and 10 can have a linearity ratio of about 1% or less for a TMR ratio of about 200% or less over a magnetic field range of ±600 Oe from a bridge signal/voltage output of zero. Linearity is one parameter to determine the performance of a TMR sensor. Linearity is a measure of the deviation of the bridge response from a pure linear response. Linearity as used herein is defined as a ratio of the maximum deviation from a straight line fit of the data over the desired field range divided by the total signal range over the desired field. A lower linearity ratio corresponds to a more linear sensor response.

In certain embodiments, the MTJs 200 of FIGS. 3-5 and 10 have shape anisotropy provided by a high width-to-height aspect ratio of the free layer. The MTJs with shape anisotropy each operate with a substantially single magnetic domain which rotates in the presence of a large external variable magnetic field, such as a variable magnetic field of ±600 Oe on top of a zero or non-zero DC field. Due to the pinning and shape anisotropy, rotation of the free layer and thus the signal response of the TMR based sensor comprising the MTJs is substantially hysteresis-free. A TMR based magnetic sensor 100 of FIGS. 1-2 comprising the MTJs 200 of FIGS. 3-5 can be fabricated to sense a variable magnetic field on top of a constant DC field, such as a working range offset from the constant DC field.

A TMR based magnetic sensor 100 of FIGS. 1-2 comprises at least one of the MTJs 200 of FIGS. 3-5 and 10 with partial pinning of the FL 310. For example, the TMR based magnetic sensor can comprises a plurality of MTJs in which one, a minority of, a majority of, or all of the MTJs have partial pinning of the FL 310.

In one embodiment, the TMR sensor 100 of FIGS. 1-2 comprising at least one of the MTJs 200 of FIGS. 3-5 and 10 with partial pinning of the FL 310 is used in a camera operating as a single axis sensor. An example of such a sensor is found in United States Patent Application Publication No.: 2019/0020822 A1, which is incorporated herein by reference. However, it is contemplated that the TMR sensor 100 may be utilized as a two dimensional or even a three dimensional sensor. Additionally, it is contemplated that TMR sensor 100 may be integrated and utilized in inertial measurement unit technologies other than cameras such as wearable devices, compasses, and MEMS devices.

Furthermore, the TMR sensor 100 may operate as a position sensor, a bridge angular sensor, a magnetic switch, a current sensor, or combinations thereof. The TMR sensor 100 may be used to focus a camera such as a smart phone camera by using the TMR sensors as position and angular sensors. Also, the TMR sensor 100 has applicability in the automotive industry as switch, current, and angular sensors to replace current Hall, anisotropic magnetoresistance (AMR) and giant magnetoresistance (GMR) sensors. TMR sensor 100 can also be used in the drones and robotics industry as position and angular sensors. Medical devices can also utilize the TMR sensor 100 for flow rate control for infusion systems and endoscope camera sensors among others. Thus, the TMR sensor 100 discussed herein has applications well beyond smart phone cameras and thus should not be limited to use as sensors for smart phone cameras. Furthermore, the MTJs of the TMR sensor 100 need not be arranged in a Wheatstone bridge arrangement, but rather, may be arranged in any number of manners.

In one embodiment, a method of fabricating a TMR based magnetic sensor in a Wheatstone configuration includes conducting a first anneal of a magnetic tunnel junction (MTJ) and conducting a second anneal of the MTJ. The MTJ includes a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second antiferromagnetic pinning layer over the free layer. The first anneal of the MTJ sets the first AFM pinning layer, the pinned layer, the free layer, and the second AFM pinning layer in a first magnetization direction. The second anneal of the MTJ resets the free layer and the second AFM pinning layer in a second magnetization direction. An operating field range of the TMR based magnetic sensor is over ±100 Oe.

In another embodiment, a method of fabricating a TMR based magnetic sensor in a Wheatstone configuration includes conducting a first anneal of a magnetic tunnel junction (MTJ) at a first external magnetic field strength, at a first external magnetic direction, and at a first temperature and conducting a second anneal of the MTJ at a second external magnetic field strength, at a second external magnetic direction, and at a second temperature. The first external magnetic field strength of the first anneal is greater than the second external magnetic field strength of the second anneal. The first external magnetic direction of the first anneal is different than the second external magnetic direction of the second anneal. The first temperature of the first anneal is greater than the second temperature of the second anneal. The MTJ includes a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second antiferromagnetic pinning layer over the free layer.

In one embodiment, a TMR based magnetic sensor in a Wheatstone configuration includes a plurality of MTJs. Each of the plurality of MTJs includes a reference layer in a first magnetization direction, a free layer, and an antiferromagnetic (AFM) pinning layer. The AFM pinning layer partially pins the free layer in a second magnetization direction orthogonal, at an acute angle, or at an obtuse angle to the first magnetization direction of the reference layer.

EXAMPLES

The following examples show data of certain embodiments of MTJs and a sensor comprising a plurality of MTJs. Such data should not be used to limit the scope of the claims unless explicitly set forth in the claims.

Example 1

Figure 7B:
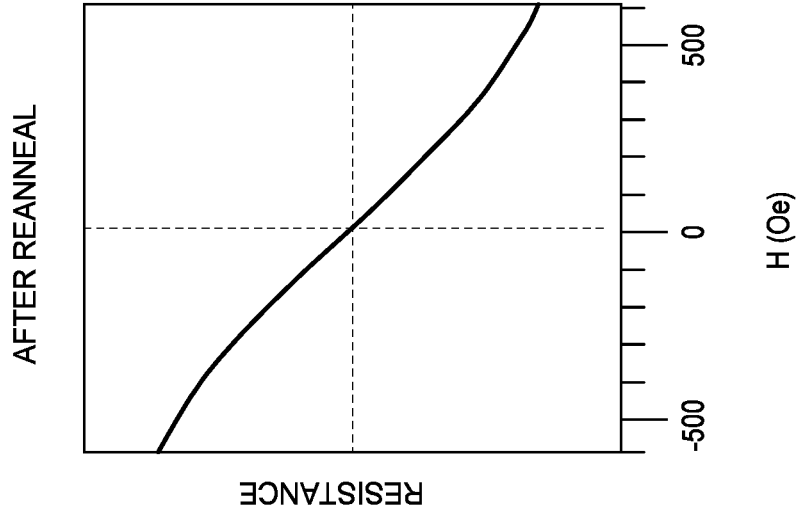
FIG. 7B show a resistance signal of the leg of a TMR based magnetic sensor 100 of FIG. 7A in which each MTJ comprises the free layer with a magnetization direction orthogonal to the magnetization direction of the reference layer after a second anneal.
Figure 7A:
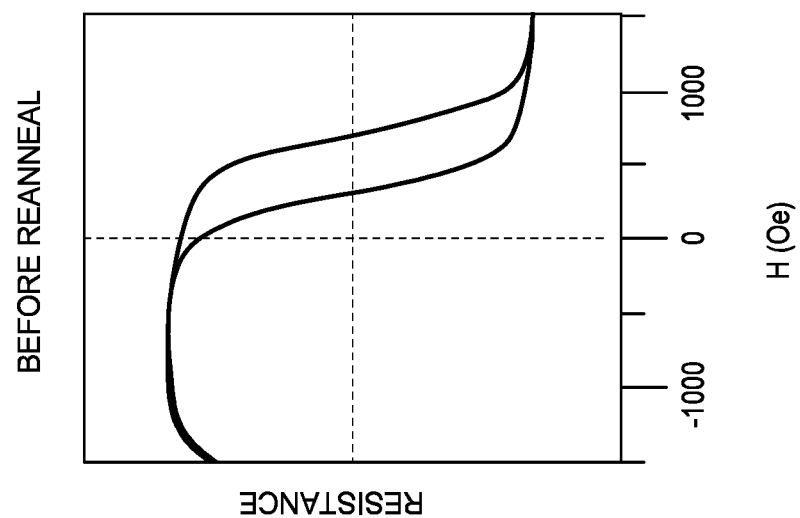
FIG. 7A shows a resistance signal of one leg of a TMR based magnetic sensor in which each MTJ comprises a free layer with a magnetization direction antiparallel to a magnetization direction of a reference layer after a first anneal.

FIG. 7A shows a resistance signal of one leg of a TMR based magnetic sensor 100 in which each MTJ 200 comprises a FL 310 with a magnetization direction antiparallel to a magnetization direction of a RL 330 after a first anneal, such as in the magnetization orientations of FIG. 4A. The TMR based magnetic sensor 100 included an array of fifty-four circular shaped MTJs 200 having a 2.6 um diameter. The sensor 100 does provide a response shifted to Hpin of about +500 Oe, but the response is highly non-linear and hysteretic.

FIG. 7B shows the resistance signal of one leg of a TMR based magnetic sensor 100 of FIG. 7A in which each MTJ 200 comprises the FL 310 with a magnetization direction orthogonal to the magnetization direction of the RL 330 after a second anneal, such as the magnetization orientations of FIG. 4B. The resistance curve has good linearity up to about 500 Oe, corresponding to the pinning field provided by AFM2.

Example 2

Figure 8:
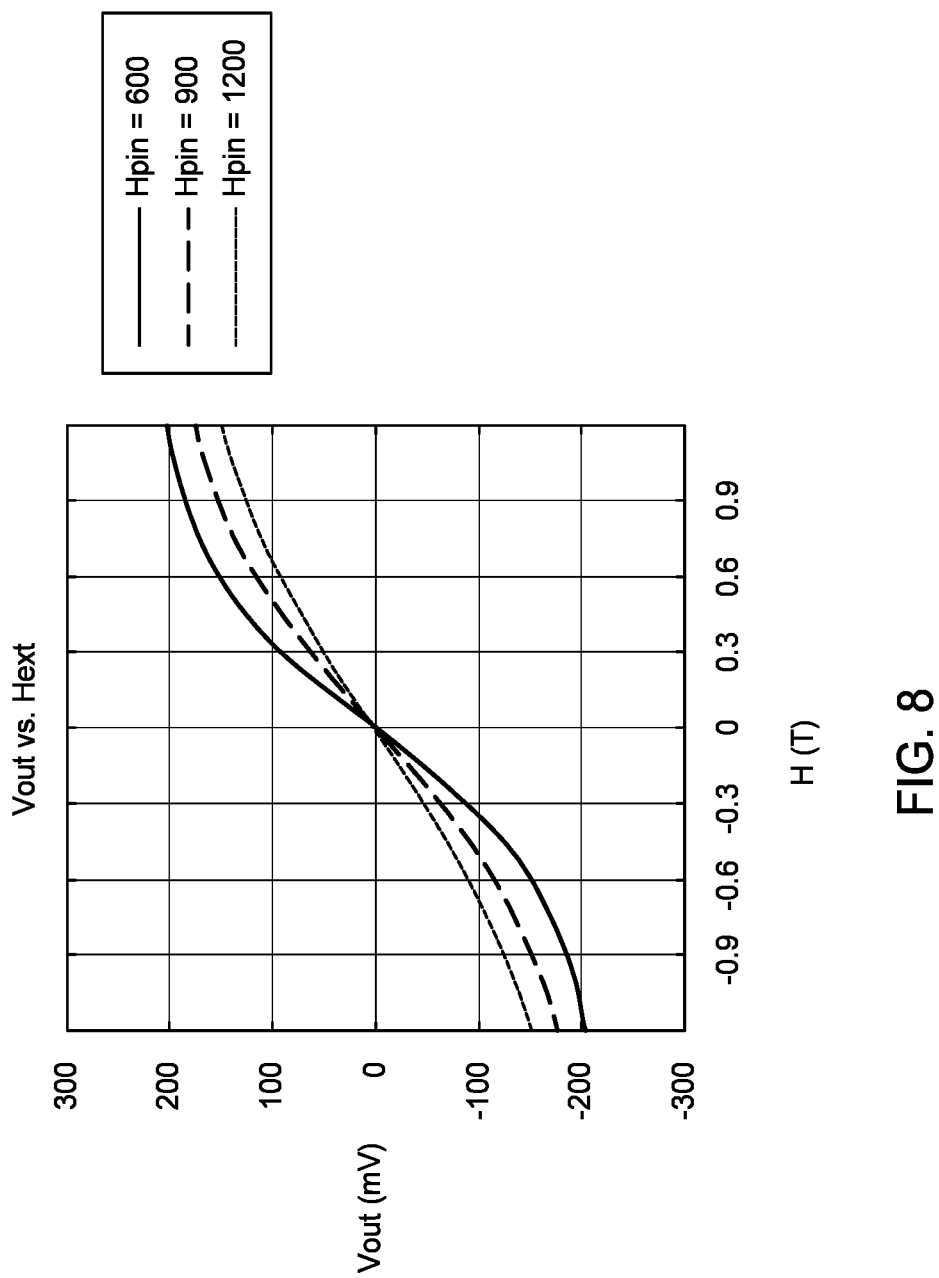
FIG. 8 is simulation of a bridge signal output of a TMR based magnetic sensor in which each MTJ comprises a free layer after a second anneal setting the free layer orthogonal to a reference layer with different pinning strengths on the free layer.

FIG. 8 is simulation of a bridge signal output of a TMR based magnetic sensor 100 in which each MTJ 200 comprises a FL 310 after a second anneal setting the FL 310 orthogonal to the RL 330, such as in the magnetization orientations of FIG. 4B. The bridge signal output is simulated over various pinning strengths of the AFM2 pinning layer 370 on FL 310. As shown in FIG. 8, the greater the amount of pinning strength of the AFM2 pinning layer 370 corresponds to a more linear bridge signal output of the sensor 100 but with less sensitivity over a larger operating magnetic field range. The lower the amount of pinning strength of the AFM2 pinning layer 370 corresponds to a less linear bridge signal output of the sensor 100 but with greater sensitivity over a smaller operating magnetic field range.

Example 3

Figure 9:
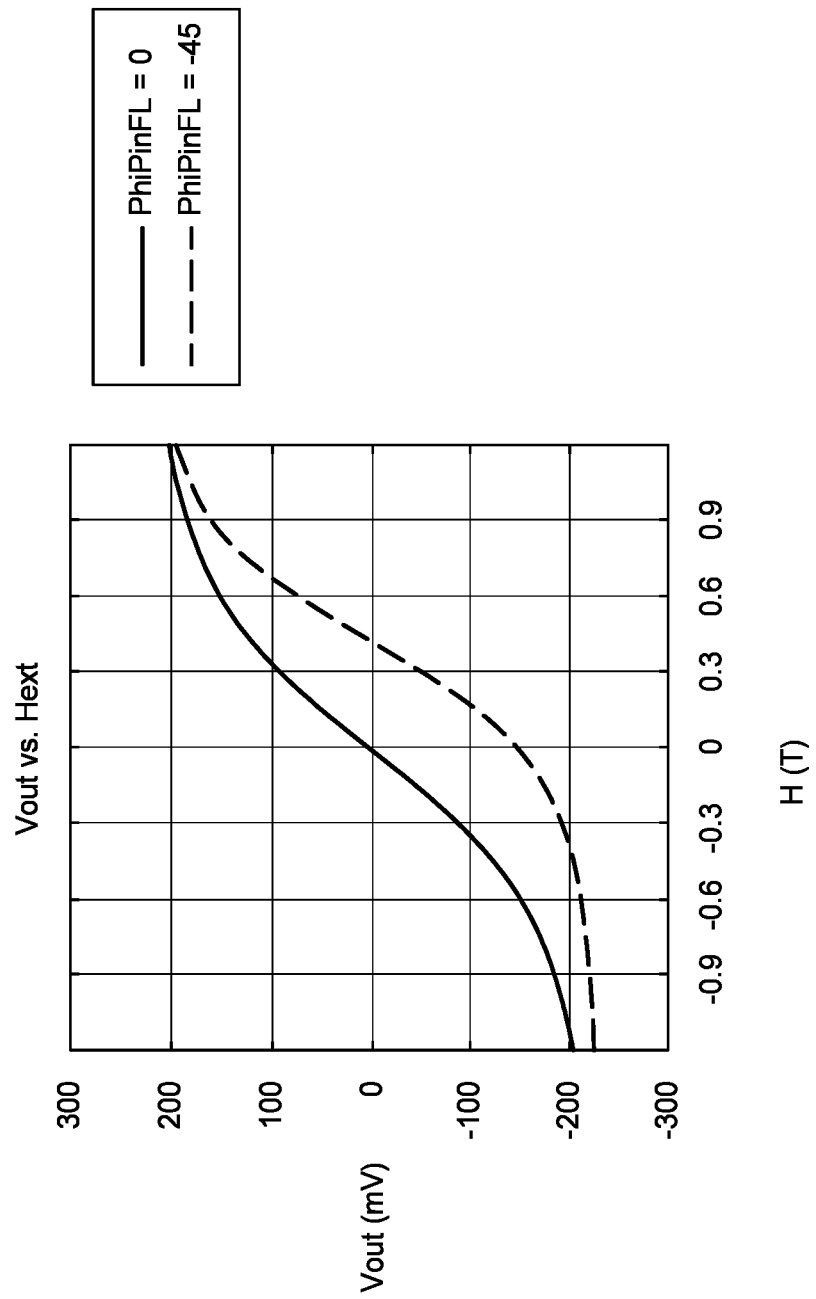
FIG. 9 is simulation of a bridge signal output of a TMR based magnetic sensor in which each MTJ comprises a free layer after a second anneal setting a magnetization direction of the free layer orthogonal or at an angle to a magnetization direction of a reference layer.

FIG. 9 is simulation of a bridge signal output of a TMR based magnetic sensor 100 in which each MTJ 200 comprises a FL 310 after a second anneal setting the FL 310. The bridge signal output is a simulation of a FL 310 with a magnetization direction partially pinned orthogonal or at an acute angle to a magnetization direction of the RL 330 corresponding to the configuration in FIG. 6. Partially pinning the magnetization direction of the FL 310 at an acute angle to the magnetization direction of the RL 330 shifts the operating range to the positive field direction due to the Hpin*sin($\ominus$) component and increases the slope due to the Hpin*cos($\ominus$) component.

While the foregoing is directed to embodiments of the present disclosure, other and further embodiments of the disclosure may be devised without departing from the basic scope thereof, and the scope thereof is determined by the claims that follow.

What is claimed is:
1. A method of fabricating a tunnel magnetoresistive (TMR) based magnetic sensor in a Wheatstone configuration, the method comprising:
 conducting a first anneal of a magnetic tunnel junction (MTJ), the MTJ comprising a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second anti-ferromagnetic pinning layer over the free layer, wherein the first anneal of the MTJ sets the first AFM pinning layer, the pinned layer, the free layer, and the second AFM pinning layer in a first magnetization direction; and conducting a second anneal of the MTJ, wherein the second anneal resets the free layer and the second AFM pinning layer in a second magnetization direction, wherein an operating field range of the TMR based magnetic sensor is over ±100 Oe.

2. The method of claim 1, wherein the second magnetization direction is selected from a group consisting of orthogonal, at an acute angle, and at an obtuse angle to a third magnetization direction of the reference layer.

3. The method of claim 1, wherein the second magnetization direction is at an acute angle to a third magnetization direction of the reference layer to form the MTJ with increased sensitivity to a positive polarity sensed magnetic field.

4. The method of claim 1, wherein the second magnetization direction is at an obtuse angle to a third magnetization direction of the reference layer to form the MTJ with increased sensitivity to a negative polarity sensed magnetic field.

5. The method of claim 1, wherein the second anneal does not substantially change the first magnetization direction of the first AFM pinning layer and the pinned layer.

6. The method of claim 1, further comprising forming the MTJ as an elongated polygon.

7. A method of fabricating a tunnel magnetoresistive (TMR) based magnetic sensor in a Wheatstone configuration, the method comprising:

conducting a first anneal of a magnetic tunnel junction (MTJ) at a first external magnetic field strength, at a first external magnetic direction, and at a first temperature, the MTJ comprising a first antiferromagnetic (AFM) pinning layer, a pinned layer over the first AFM pinning layer, an anti-parallel coupled layer over the pinned layer, a reference layer over the anti-parallel coupled layer, a barrier layer over the reference layer, a free layer over the barrier layer, and a second antiferromagnetic pinning layer over the free layer, conducting a second anneal of the MTJ at a second external magnetic field strength, at a second external magnetic direction, and at a second temperature, wherein the first external magnetic field strength is greater than the second external magnetic field strength, the first external magnetic direction is different than the second external magnetic direction, and the first temperature is greater than the second temperature.

8. The method of claim 7, wherein the first external magnetic field strength is about 3.5 T or above and the second external magnetic field strength is from about 400 Oe to about 2,500 Oe.

9. The method of claim 7, wherein the second external magnetic direction is selected from a group consisting of orthogonal, at an acute angle, and at an obtuse angle to a magnetization direction of the reference layer.

10. The method of claim 7, wherein the second external magnetic direction at an acute angle to a magnetization direction of the reference layer to form the MTJ with increased sensitivity to a positive polarity sensed magnetic field.

11. The method of claim 7, wherein the second external magnetic direction at an obtuse angle to a magnetization direction of the reference layer to form the MTJ with increased sensitivity to a negative polarity sensed magnetic field.

12. The method of claim 7, wherein the first temperature is about 250° C. or above and wherein the second temperature is from about 130° C. to about 230° C.

13. The method of claim 7, wherein the first anneal is conducted for a time period longer than the second anneal.

14. A tunnel magnetoresistive (TMR) based magnetic sensor in a Wheatstone configuration, comprising:

a plurality of magnetic tunnel junctions (MTJs), each of the plurality of MTJs comprising:
a reference layer in a first magnetization direction;
a free layer; and
an antiferromagnetic pinning layer partially pinning the free layer in a second magnetization direction selected from a group consisting of orthogonal, at an acute angle, and at an obtuse angle to the first magnetization direction of the reference layer, wherein:
the plurality of MTJs form two positive polarity magnetoresistance legs and two negative polarity magnetoresistance legs,
the two positive polarity magnetoresistance legs comprise a first portion of the plurality of MTJs,
the two negative polarity magnetoresistance legs comprise a second portion of the plurality of MTJs, and
the first portion has the second magnetization of the free layer different from the second portion.

15. The TMR based magnetic sensor of claim 14, wherein the plurality of MTJs are free of hard bias stabilization.

16. The TMR based magnetic sensor of claim 14, wherein each of the plurality of MTJs is shaped as an elongated polygon.

17. The TMR based magnetic sensor of claim 16, wherein the elongated polygon has a width and a height with a width-to-height aspect ratio of about 4:1 or more.

18. The TMR based magnetic sensor of claim 14, wherein a pinning strength of the antiferromagnetic pinning layer partially pinning the free layer is about 400 Oe or greater.

19. A tunnel magnetoresistive (TMR) based magnetic sensor in a Wheatstone configuration, comprising:

a plurality of magnetic tunnel junctions (MTJs), each of the plurality of MTJs comprising:
a reference layer in a first magnetization direction;
a free layer; and
an antiferromagnetic pinning layer partially pinning the free layer in a second magnetization direction selected from a group consisting of orthogonal, at an acute angle, and at an obtuse angle to the first magnetization direction of the reference layer,
wherein each of the plurality of MTJs is shaped as an elongated polygon, and wherein the elongated polygon has a width and a height with a width-to-height aspect ratio of about 4:1 or more.

20. The TMR based magnetic sensor of claim 19, wherein the plurality of MTJs are free of hard bias stabilization, and wherein each of the plurality of MTJs is shaped as an elongated polygon.

* * * * *